United States Patent [19]

Suzuki et al.

[11] Patent Number: 4,692,640
[45] Date of Patent: Sep. 8, 1987

[54] MAJORITY CIRCUIT COMPRISING BINARY COUNTER

[75] Inventors: Seigo Suzuki, Tokyo; Yukihiko Yabe; Masumi Kawakami, both of Yokohama, all of Japan

[73] Assignee: Kabushiki Kaisha Toshiba, Kawasaki, Japan

[21] Appl. No.: 811,449

[22] Filed: Dec. 20, 1985

[30] Foreign Application Priority Data

Dec. 26, 1984 [JP] Japan ................ 59-273422

[51] Int. Cl.$^4$ ............................................. H03K 23/48
[52] U.S. Cl. .................................. 307/464; 307/465; 377/33; 377/108; 377/118
[58] Field of Search ............... 307/464, 465; 377/33, 377/47, 49, 107, 108, 118

[56] References Cited

U.S. PATENT DOCUMENTS

| | | | |
|---|---|---|---|
| 4,027,175 | 5/1977 | Hurst | 307/464 |
| 4,091,293 | 5/1978 | Ando | 307/464 |
| 4,158,767 | 6/1979 | Long | 377/49 X |
| 4,375,683 | 3/1983 | Wensley | 307/464 X |
| 4,394,769 | 7/1983 | Lull | 377/108 X |

Primary Examiner—Stanley D. Miller
Assistant Examiner—D. R. Hudspeth
Attorney, Agent, or Firm—Finnegan, Henderson, Farabow, Garrett and Dunner

[57] ABSTRACT

The majority circuit has an $(n+1)/2$-notation counter circuit comprising a plurality of cascade-connected binary counters. An odd number of n-bit serial data are counted by the counter circuit, and an output of the binary counter of the last stage is taken out as a majority output of the majority circuit.

7 Claims, 28 Drawing Figures

MAJORITY CIRCUIT COMPRISING BINARY COUNTER

BACKGROUND OF THE INVENTION

The present invention relates to a majority circuit to determine a majority of the level of a digital signal of a plurality of serial bits.

In the field of digital circuits, majority circuits to determine a majority of the level ("1" level or "0" level) of a digital signal of a plurality of serial bits are widely used.

Figure 1:
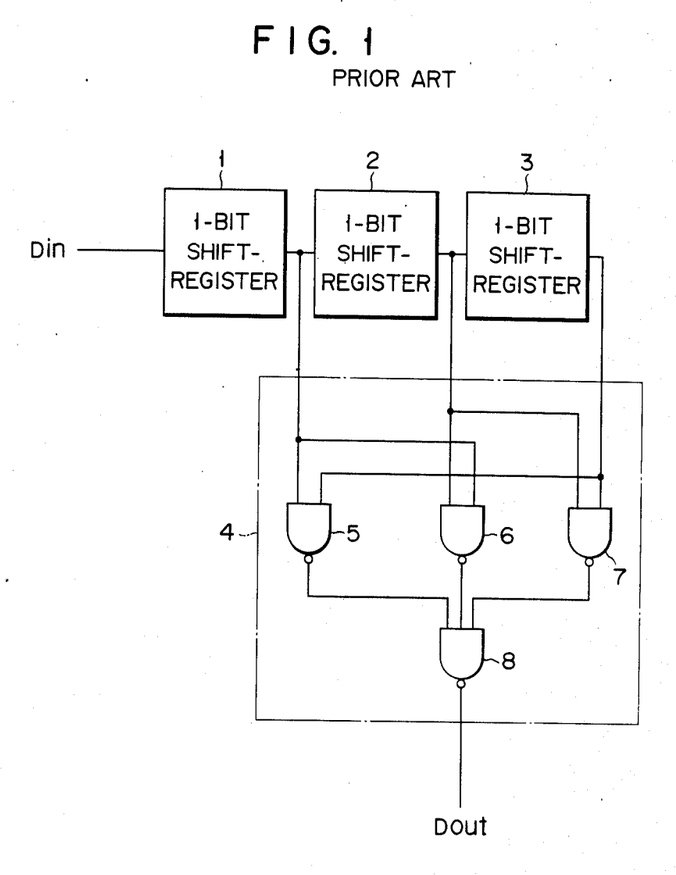
FIG. 1 is a diagram showing a conventional majority circuit.

FIG. 1 shows an example of conventional majority circuits. The majority circuit receives a serial digital signal $D_{in}$ of three bits and determines a majority logic of the signal. The majority circuit comprises one-bit shift registers 1 to 3 which are cascade connected and a gate circuit 4. Gate circuit 4 comprises NAND gates 5 to 8.

Three-bit input serial data $D_{in}$ is inputted shift register 1 of the first stage. Each of shift registers 1 to 3 shifts the input data by one bit synchronously with a clock signal. Output signals of shift registers 1 to 3 are inputted to NAND gates 5 to 7 in gate circuit 4. Output signals of NAND gates 5 to 7 are inputted to NAND gate 8 and an output signal of NAND gate 8 becomes a majority output $D_{out}$.

In the majority circuit of FIG. 1, the one-bit shift registers equal to the number of input serial bits are cascade connected to constitute a counter circuit, the input serial bits are converted to parallel bits, and the parallel bit data is inputted to gate circuit 4, thereby obtaining a majority output.

The circuit arrangement of FIG. 1 requires the 1-bit shift registers equal to the number of input bits. Therefore, as the number "n" of input bits increases, the number of shift registers required also increases. Further, the number of NAND gates constituting gate circuit 4 also increases.

Figure 2:
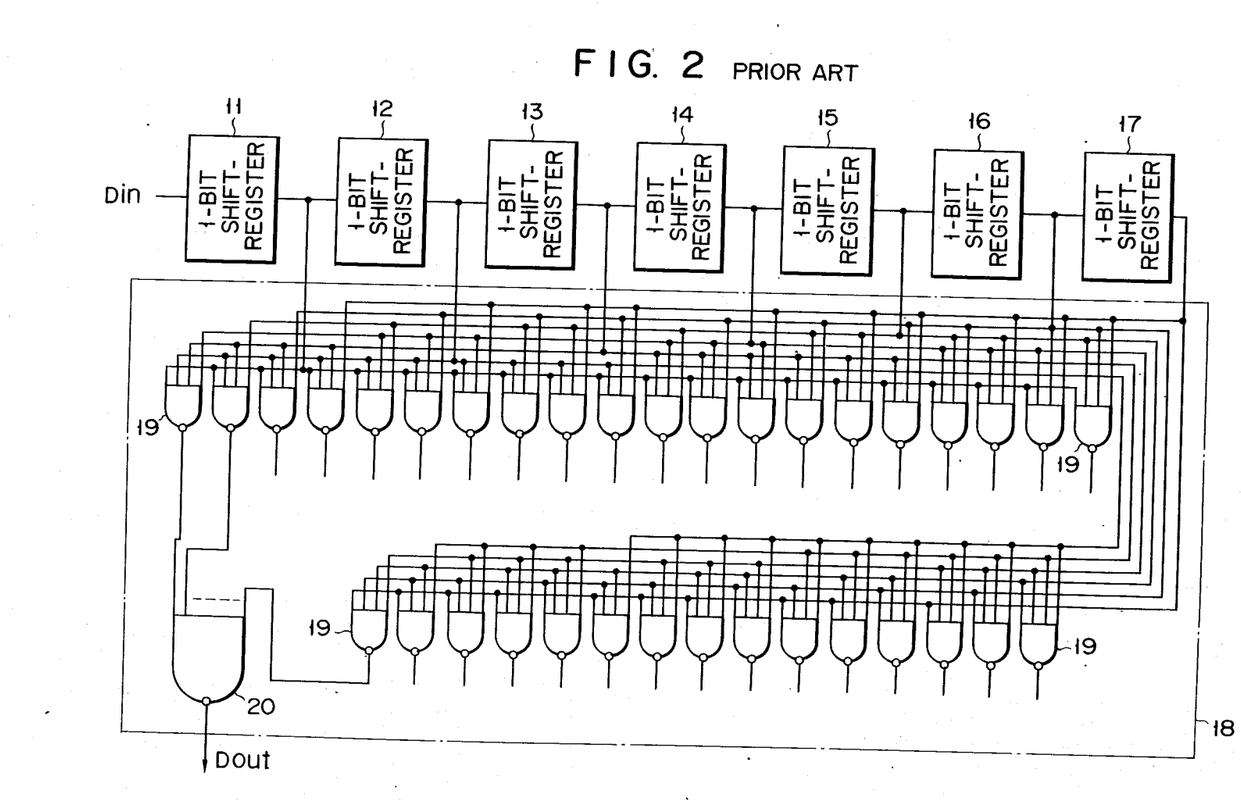
FIG. 2 is a diagram showing another conventional majority circuit.

For example, a majority circuit for seven input bits constituted using the circuit arrangement shown in FIG. 1 has a circuit arrangement as shown in FIG. 2. As shown in FIG. 2, seven shift registers 11 to 17 are needed as shift registers constituting a counter circuit, and thirty-five 4-input NAND gates 19 and one 35-input NAND gate 20 are needed as gate logic elements constituting a gate circuit. As mentioned above, in the conventional circuit arrangement as shown in FIG. 1, the number of logic elements required remarkably increases with an increase in number of input bits. Moreover, the wirings among those elements also become complicated in association with the increase in number of elements. Consequently, there is a problem such that the size of the required chip enlarges.

SUMMARY OF THE INVENTION

The present invention is made in consideration of the above-mentioned circumstances and it is an object of the invention to provide a majority circuit in which a circuit arrangement is simple and the chip size is reduced due to such a simple arrangement.

According to the invention, there is provided a majority circuit comprising an input terminal to which an odd number of serial data of n bits are inputted, a counter circuit of a (n+1)/2 notation of a plurality of cascade connected binary counters for counting the serial data inputted to said input terminal, and an output terminal at which an output of said binary counter of the last stage of said counter circuit is taken out as a majority output of said serial data.

DETAILED DESCRIPTION OF THE PREFERRED EMBODIMENTS

Figure 3:
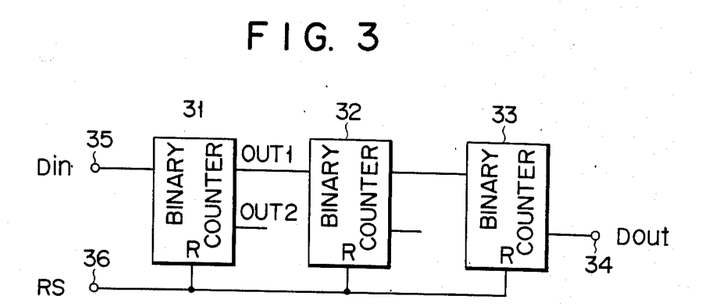
FIG. 3 is a diagram showing a majority circuit according to an embodiment of the present invention.

FIG. 3 shows a majority circuit according to an embodiment of the present invention. The circuit of FIG. 3 is for seven input bits.

The majority circuit shown in FIG. 3 comprises a quaternary counter circuit comprising three binary counters 31 to 33 which are cascade connected. An input of binary counter 31 of the first stage is connected to an input terminal 35 of the majority circuit. Input data $D_{in}$ is inputted to input terminal 35. An output terminal of binary counter 33 of the last stage is connected to an output terminal 34 of the majority circuit. Majority output $D_{out}$ is taken out from the output terminal 34. Reset terminals R of binary counters 31 to 33 are connected to a reset terminal 36, respectively. A reset signal RS is inputted to the reset terminal 36.

Figure 4:
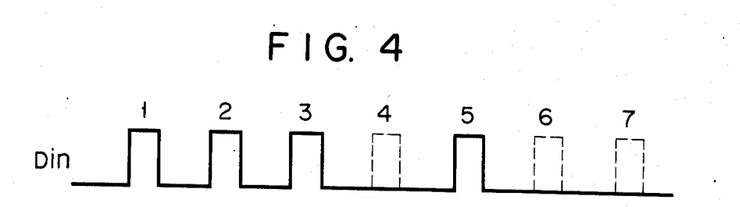
FIGS. 4 and 5 are diagrams showing serial data which is inputted to the majority circuit of FIG. 3, respectively.

In such an arrangement, reset signal RS of a "1" level is first inputted to input terminal 36, so that binary counters 31 to 33 are respectively reset and outputs of binary counters 31 to 33 become a "0" level (i.e., 0, 0, 0), respectively. Then, serial data $D_{in}$ whose majority is to be determined is inputted. As shown in FIG. 4, it is now assumed that three bits of the fourth, sixth, and seventh bits of input serial data $D_{in}$ are at a "0" level and other four bits are at a "1" level. The majority logic of the serial data $D_{in}$ is at a "1" level. After all seven bits of serial data $D_{in}$ have been inputted, the output signals of binary counters 31 and 32 become a "0" level and the output signal of binary counter 33 becomes a "1" level (i.e., 0, 0, 1). Majority output $D_{out}$ of the majority circuit of FIG. 3 is the output of binary counter 33, so that majority output $D_{out}$ of serial data $D_{in}$ becomes a "1" level.

Figure 5:
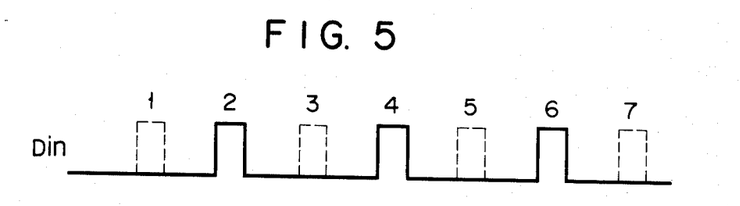

The case where serial data $D_{in}$ shown in FIG. 5 was inputted will then be considered. In this case as well, before this serial data $D_{in}$ is inputted, reset signal RS of a "1" level is inputted to input terminal 36. Thus, binary counters 31 to 33 are respectively reset and the outputs of binary counters 31 to 33 are set to a "0" level, respectively. Then, serial data $D_{in}$ of FIG. 5 whose majority is to be determined is inputted. As shown in FIG. 5, three bits of the second, fourth, and sixth bits of serial data $D_{in}$ are at a "1" level and other four bits are at a "0" level. The majority logic of the serial data $D_{in}$ becomes a "0" level. After all seven bits of serial data $D_{in}$ have been inputted, the output signals of binary counters 31 and 32 become a "1" level and the output signal of binary counter 31 becomes a "0" level (i.e., 1, 1, 0). Since the majority output of the majority circuit of FIG. 1 is the output of binary counter 33, majority output $D_{out}$ of serial data $D_{in}$ becomes a "0" level.

In this manner, in the majority circuit of FIG. 3, the output signal of binary counter 33 of the last stage of the quaternary counter circuit is taken out as majority output $D_{out}$.

As will be obvious from this embodiment, in order to get the majority logic of serial data $D_{in}$ of n bits (n is an odd number of three or more), k binary counters ($n=2^k-1$) are cascade connected to form a modulo $(n+1)/2$ counter circuit and an output signal of the counter of the last stage is taken out as majority signal $D_{out}$. Thus, the circuit arrangement can be simplified. Therefore, when this majority circuit is manufactured is a form of an IC (integrated circuit), the chip size can be miniaturized.

Figure 6:
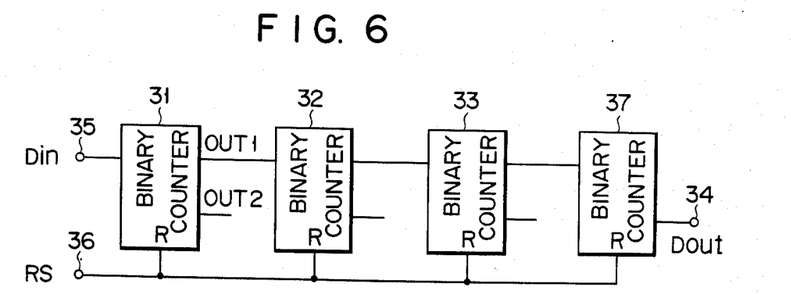
FIG. 6 is a diagram showing a majority circuit according to another embodiment of the invention.

FIG. 6 shows a majority circuit for the input serial data of fifteen bits. In the circuit of FIG. 6, binary counter 37 is added to the circuit of FIG. 3. The majority circuit shown in FIG. 6 comprises a modulo (or notation) 8 counter circuit in which four binary counters 31 to 33 and 37 are cascade connected. An input of binary counter 31 of the first stage is connected to an input terminal 35 of the majority circuit. Input data $D_{in}$ is inputted to input terminal 35. An output terminal of binary counter 37 of the last stage is connected to an output terminal 34 of the majority circuit. Majority output $D_{out}$ is taken out from the output terminal 34. Reset terminals R of binary counters 31 to 33 and 37 are connected to a reset terminal 36, respectively. A reset signal RS is inputted to the reset terminal 36.

In the arrangement of FIG. 6, reset signal RS of a "1" level is first inputted to input terminal 36, so that binary counters 31 to 33 and 37 are respectively reset and outputs of binary counters 31 to 33 and 37 become a "0" level (i.e., 0, 0, 0, 0), respectively. Then, serial data $D_{in}$ whose majority is to be determined is inputted. It is now assumed that seven of those fifteen bits of input serial data $D_{in}$ are at a "0" level and the other eight bits are at a "1" level. The majority logic of the serial data $D_{in}$ is at a "1" level. After all fifteen bits of serial data $D_{in}$ have been inputted, the output signals of binary counters 31, 32 and 33 become a "0" level and the output signal of binary counter 37 becomes a "1" level (i.e. 0, 0, 0, 1). Majority output $D_{out}$ of the majority circuit of FIG. 6 is the output of binary counter 37, so that majority output $D_{out}$ of serial data $D_{in}$ becomes a "1" level.

It is assumed that seven of those fifteen bits of serial data $D_{in}$ are at a "1" level and the other eight bits are at a "0" level. The majority logic of the serial data $D_{in}$ becomes a "0" level. After all fifteen bits of serial data $D_{in}$ have been inputted, the output signals of binary counters 31, 32 and 33 become a "1" level and the output signal of binary counter 37 becomes a "0" level (i.e., 1, 1, 1, 0). Since the majority output of the majority circuit of FIG. 6 is the output of binary counter 37, majority output $D_{out}$ of serial data $D_{in}$ becomes a "0" level.

In this manner, in the majority circuit of FIG. 6, the output signal of binary counter 37 of the last stage circuit is taken out as majority output $D_{out}$.

Figure 7:
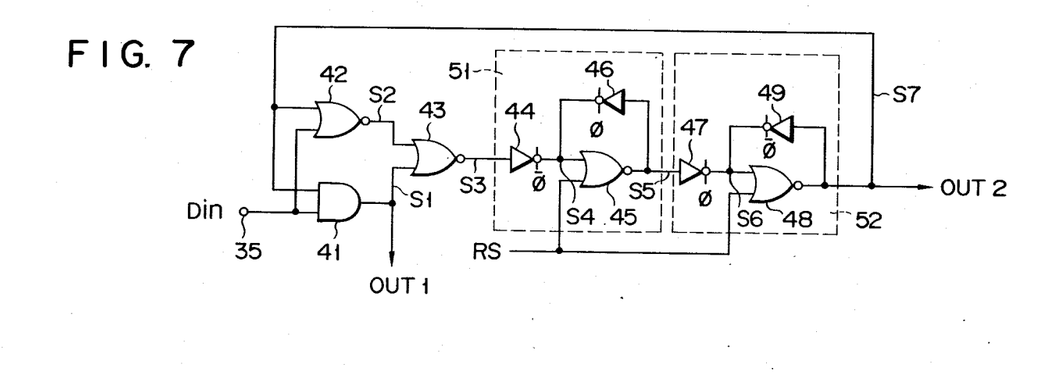
FIG. 7 is a detailed circuit diagram of a binary counter in the majority circuits of FIGS. 3 and 6.

FIG. 7 shows a practical arrangement of binary counter 31 in the majority circuits of FIGS. 3 and 6. The arrangements of the other binary counters are also substantially the same as that of binary counter 31. In the binary counter of FIG. 7, input serial data $D_{in}$ is inputted, through input terminal 35, to one input terminal of a two-input AND gate 41 and to one input terminal of a two-input NOR gate 42. An output signal S1 of AND gate 41 and an output signal S2 of NOR gate 42 are inputted to input terminals of two-input NOR gate 43. Output signal S1 of AND gate 41 is also applied to binary counter 32 of the next stage as carry signal OUT1. An output signal S3 of NOR gate 43 is inputted to a clocked inverter 44. Clocked inverter 44 is controlled by a clock signal $\overline{\phi}$ (FIG. 8(b)) and operates for the period of time when clock signal $\overline{\phi}$ is at a "1" level. An output signal S4 of clocked inverter 44 and reset signal RS are inputted to a two-input NOR gate 45. An input terminal of a clocked inverter 46 is connected to an output terminal of NOR gate 45 and an output terminal of inverter 46 is connected to an output terminal of clocked inverter 44. Clocked inverter 46 is controlled by a clock signal $\phi$ and operates for the period of time when clock signal $\phi$ (FIG. 8(a)) is at a "1" level. An output signal S5 of NOR gate 45 is inputted to a clocked inverter 47. Clocked inverter 47 is also controlled by clock signal $\phi$ and operates for the period of time when clock signal $\phi$ is at a "1" level. An output signal S6 of clocked inverter 47 and reset signal RS are inputted to a two-input NOR gate 48. An input terminal of a clocked inverter 49 is connected to an output terminal of NOR gate 48 and an output terminal of inverter 49 is connected to an output terminal of clocked inverter 47. Clocked inverter 49 is controlled by clock signal $\overline{\phi}$ and operates for the period of time when clock signal $\overline{\phi}$ is at a "1" level. An output signal S7 of NOR gate 48 is inputted to the other input terminals of AND gate 41 and NOR gate 42. Output signal S7 of NOR gate 48 constitutes majority output $D_{out}$ in the case where binary counter 31 is considered to be the counter of the last stage.

Clocked inverter 44, NOR gate 45, and clocked inverter 46 constitute a half-bit shift circuit 51 to shift output signal S3 of NOR gate 43 by a half bit of clock signal $\phi$. Clocked inverter 47, NOR gate 48, and clocked inverter 49 constitute a half-bit shift circuit 52 to shift output signal S5 of half-bit shift circuit 51 by half bit of clock signal $\overline{\phi}$. Half-bit shift circuits 51 and 52 constitute a one-bit shift circuit.

Figure 8:
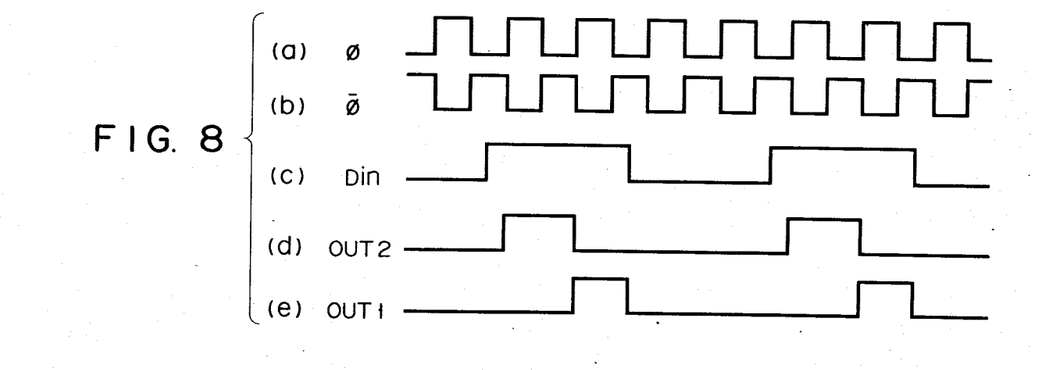
FIGS. 8(a), 8(b), 8(c), 8(d) and 8(e) are time charts of signals of respective sections of the binary counter shown in FIG. 7.

In the binary counter of the arrangement of FIG. 7, reset signal RS is first set at a "1" level, so that the output signals of NOR gates 45 and 48, namely, output signals S5 and S7 of half-bit shift circuits 51 and 52 become a "0" level. Thus, output signals OUT1 (FIG. 8(e)) and OUT2 (FIG. 8(d)) are set at a "0" level irrespective of input signal $D_{in}$ (FIG. 8(c)). Then, reset signal RS is set at a "0" level. In this state, when input signal $D_{in}$ as shown in FIG. 8C is inputted, output signal OUT2 becomes a signal as shown in FIG. 8D which changes in response to the leading edge of clock signal $\phi$.

Figure 9:
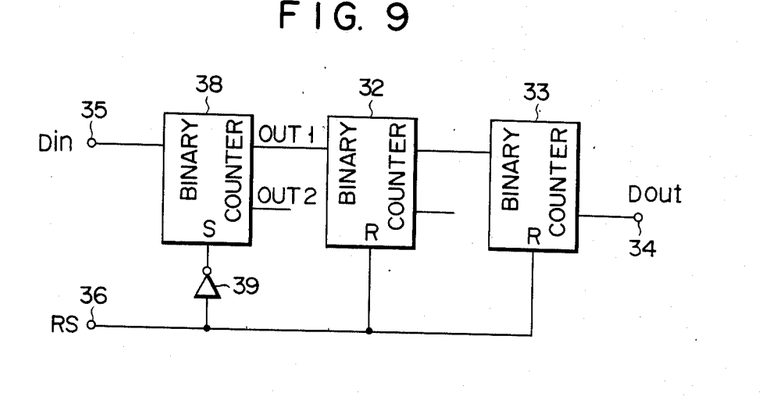
FIG. 9 is a diagram showing a majority circuit according to still another embodiment of the invention.

The majority circuits shown in FIGS. 3 and 6 intend to determine the majority logics of the serial data of seven bits and fifteen bits, respectively. In other words, the majority circuits shown in FIGS. 3 and 6 fundamentally intend to determine the majority logics for the serial data of $(2^k-1)$ bits, for example, three, seven, fifteen, ... bits, but cannot determine the majority logic of a serial data of bits of the number other than $(2^k-1)$, e.g., the serial data of five bits. FIG. 9 is a diagram according to another embodiment of the present invention to obtain a majority output of the serial data of five bits. A different point of the embodiment of FIG. 9 from the embodiment of FIG. 3 is that binary counter 31 with reset terminals R is replaced by a binary counter 38 with a set terminal S. Further, an inverter 39 is provided between reset terminal 36 and set terminal S of binary counter 38. Reset signal RS is inputted to set terminal S of binary counter 38 through inverter 39.

When a reset signal RS of a "0" level is inputted to reset terminal 36, then a set signal of "1" level is inputted to set terminal S of binary counter 38 to set binary counter 38. Then, an output signal OUT1 (carry signal) of binary counter 38 to a binary counter 32 of the next stage becomes a "1" level, while the reset signal RS of "0" level is inputted to other binary counters 32 and 33 to reset binary counters 32 and 33. Then, output signals (carry signals) of binary counters 32 and 33 become "0" level. Therefore, output signals of binary counters 38, 32 and 33 are (1, 0, 0). Therefore, in the majority circuit of the embodiment of FIG. 9, when three bits of the input signal of a "1" level are inputted, the output signal of binary counter 33 of the last stage becomes a "1" level. Thus the majority circuit of FIG. 9 functions to determine a majority of a five-bit input signal.

Figure 10:
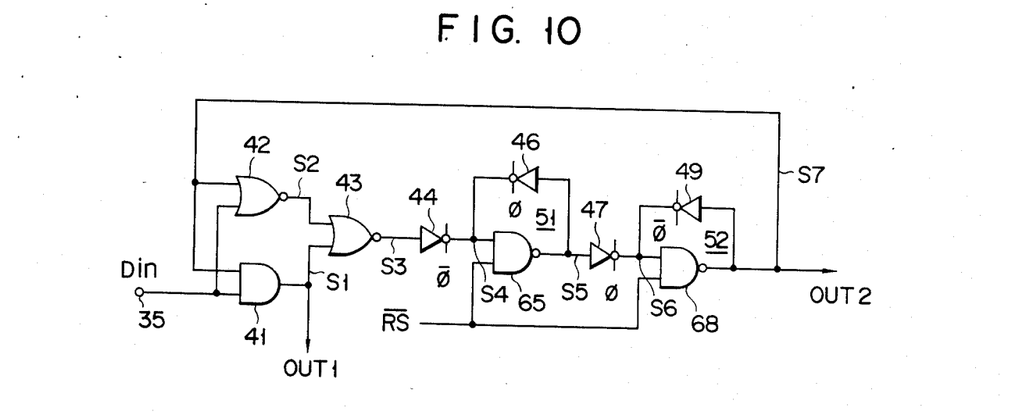
FIG. 10 is a detailed circuit diagram of a binary counter in the majority circuit of FIG. 9.

FIG. 10 shows a detailed circuit arrangement of binary counter 38 in the majority circuit of FIG. 9. Binary counter 38 of FIG. 10 uses NAND gates 65 and 68 in place of NOR gates 45 and 48 in the binary counter shown in FIG. 7.

In the binary counter 38 of FIG. 10, input serial data $D_{in}$ is inputted, through input terminal 35, to one input terminal of a two-input AND gate 41 and to one input terminal of a two-input NOR gate 42. An output signal S1 of AND gate 41 and an output signal S2 of NOR gate 42 are inputted to input terminals of two-input NOR gate 43. Output signal S1 of AND gate 41 is also applied to binary counter 32 of the next stage as carry signal OUT1. An output signal S3 of NOR gate 43 is inputted to a clocked inverter 44. Clocked inverter 44 is controlled by a clock signal $\overline{\phi}$ (FIG. 8(b)) and operates for the period of time when clock signal $\overline{\phi}$ is at a "1" level. An output signal S4 of clocked inverter 44 and reset signal $\overline{RS}$ are inputted to a two-input NAND gate 65. An input terminal of a clocked inverter 46 is connected to an output terminal of NAND gate 65 and an output terminal of inverter 46 is connected to an output terminal of clocked inverter 44. Clocked inverter 46 is controlled by a clock signal $\phi$ and operates for the period of time when clock signal $\phi$ (FIG. 8(a)) is at a "1" level. An output signal S5 of NAND gate 65 is inputted to a clocked inverter 47. Clocked inverter 47 is also controlled by clock signal $\phi$ and operates for the period of time when clock signal $\phi$ is at a "1" level. An ouput signal $S_6$ of clocked inverter 47 and reset signal $\overline{RS}$ are inputted to a two-input NAND gate 68. An input terminal of a clocked inverter 49 is connected to an output terminal of NAND gate 68 and an output terminal of inverter 49 is connected to an output terminal of clocked inverter 47. Clocked inverter 49 is controlled by clock signal $\overline{\phi}$ and operates for the period of time when clock signal $\overline{\phi}$ is at a "1" level. An output signal S7 of NAND gate 68 is inputted to the other input terminals of AND gate 41 and NOR gate 42. Output signal S7 of NAND gate 68 constitutes majority output $D_{out}$ in the case where binary counter 38 is considered to be the counter 33 of the last stage.

Clocked inverter 44, NAND gate 65, and clocked inverter 46 constitute a half-bit shift circuit 51 to shift output signal S3 of NOR gate 43 by a half bit of clock signal $\phi$. Clocked inverter 47, NAND gate 68, and clocked inverter 49 constitute a half-bit shift circuit 52 to shift output signal S5 of half-bit shift circuit 51 by half bit of clock signal $\overline{\phi}$. Half-bit shift circuits 51 and 52 constitute a one-bit shift circuit.

In binary counter 38 of FIG. 10, when reset signal RS of a "1" level is inputted, a signal of a "0" level is inputted to NAND gate 65 and 68 through inverter 39. Thus, output signals of NAND gate 65 and 68 become a "1" level, respectively.

The embodiment of FIG. 9 is used for a 5-bit input. However, by properly selecting the number of stages of the binary counters which are cascade connected and the stage using the binary counter with the set function, it is possible to provide the majority circuit which can determine a majority output of other input data of bits of an odd number other than $(2^k-1)$. For example, the majority circuit for a 13-bit input can be provided by replacing binary counter 31 of the first stage in the majority circuit of FIG. 6 by a binary counter with the set function.

Figure 11:
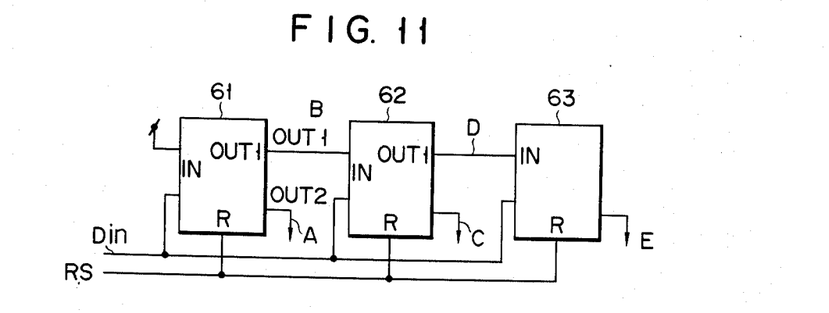
FIG. 11 is a diagram showing a majority circuit according to a further embodiment of the invention.

FIG. 11 shows a majority circuit of still another embodiment according to the invention. The majority circuit of FIG. 11 is intended for seven input serial bits. The majority circuit comprises three binary counters 61, 62 and 63 cascade connected. Binary counters 61 to 63 have reset terminal R. Reset signal RS is inputted to reset terminals RS of binary counters 61 to 63. Input serial seven bits are inputted to binary counters 61 to 63. In this embodiment of FIG. 11, input serial bits are used as clock signals $\phi$, $\phi$. Input terminal IN of binary counter 61 at the first stage is connected to a predetermined carry signal. Input terminals IN of binary counters 62, 63 are connected to output signals (carry signal) OUT1 of binary counters 61 and 62, respectively.

Figure 12:
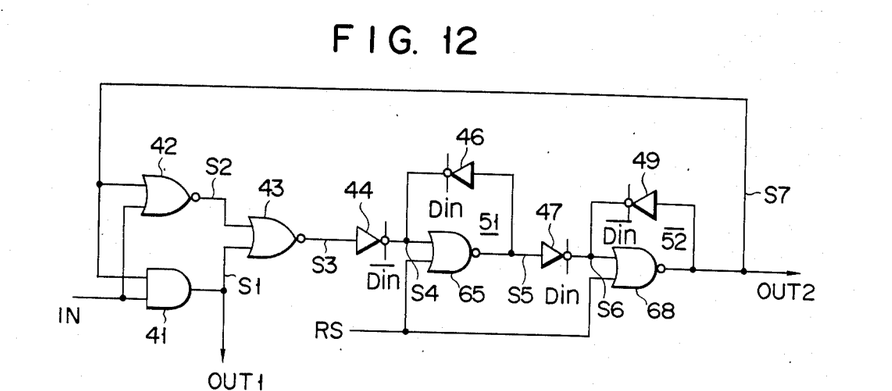
FIG. 12 is a detailed circuit diagram of a binary counter in the majority circuit of FIG. 11.

FIG. 12 shows a detailed circuit of binary counter 61. The circuit of FIG. 12 is different from the circuit of FIG. 7 is that clocked inverters 44 and 49 are controlled, not by clock pulse $\overline{\phi}$, but by phase inverted input serial bits signal $\overline{D_{in}}$. Also, clock inverter 46 and 47 are controlled, not by clock pulse $\phi$, but by input serial bits signal $D_{in}$. Clocked inverters 44 and 49 operate when phase inverted bits signal $\overline{D_{in}}$ is at a "1" level. Clocked inverters 46 and 47 operate when bits signal $D_{in}$ is at a "1" level. Others are substantially the same as those in the circuit as shown in FIG. 7.

Figure 13:
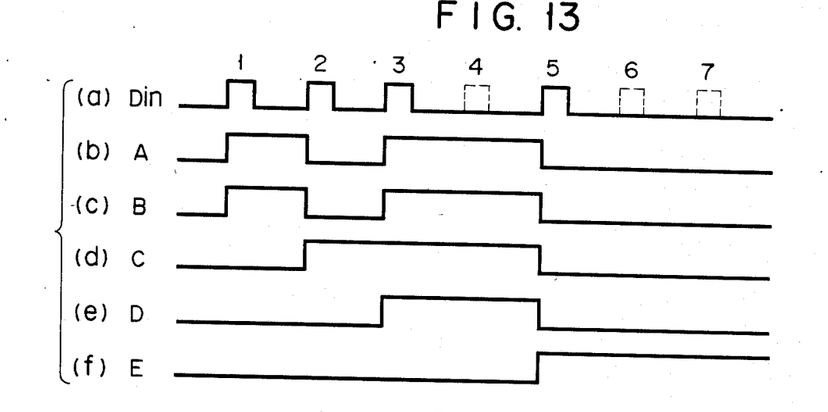
FIGS. 13(a), 13(b), 13(c), 13(d), 13(e) and 13(f) are time charts of signals of respective sections of the majority circuit shown in FIG. 11.

FIGS. 13(a) to 13(f) show time charts of signals at the respective portions of the circuit of FIG. 11 appearing when input signal $D_{in}$ have four "1" level bits, as shown in FIG. 13(a). Reference letters A, B, C, D and E are commonly used in FIG. 11 and FIGS. 13(b) to 13(f). As shown in FIG. 13(f), majority output E has "1" level, when the fourth bit of "1" level is inputted.

Figure 14:
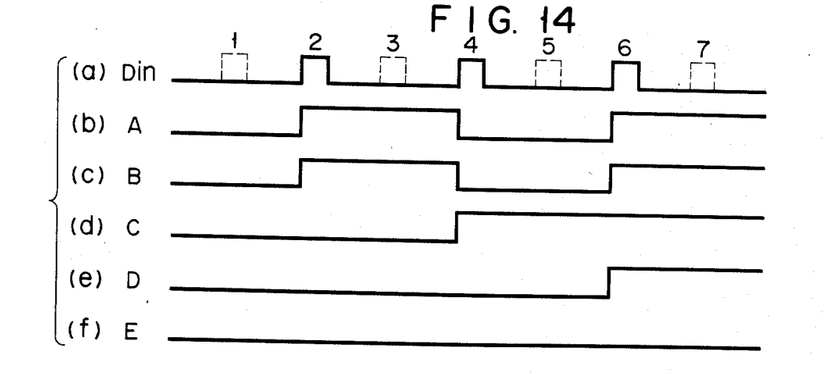
FIGS. 14(a), 14(b), 14(c), 14(d), 14(e) and 14(f) are time charts of signals of respective sections of the majority circuit shown in FIG. 11.

FIGS. 14(a) to 14(f) show time charts of signals at the respective portions of the circuit of FIG. 11 appearing when input signal $D_{in}$ have three "1" level bits, as shown in FIG. 14(a). Reference letters A, B, C, D and E are commonly used in FIG. 11 and FIGS. 14(b) to 14(f). As shown in FIG. 14(f), majority output E has "0" level.

As clearly understood from the above, in a majority circuit according to the invention, in order to get the majority logic of serial data $D_{in}$ of n bits (n is an odd number of three or more), k binary counters ($n=2^k-1$) (if k is a fraction, it is rounded up to the next whole number) are cascade connected to form a modulo $(n+1)/2$ counter circuit and an output signal of the counter of the last stage is taken out as majority signal $D_{out}$. Thus, it is possible to provide a majority circuit in which a circuit arrangement is simple and which is suitable to produce an integrated circuit.

What is claimed is:

1. A circuit for indicating the binary logic level of a majority of bits in a serial data input of n bits, in which n is an odd integer not less than 3, comprising:
   a serial data input terminal for receiving the serial data input of n bits;
   a majority output terminal for providing a majority output signal for indicating the binary logic level of the majority of bits in the serial data input, in which the majority is an integer equal to $(n+1)/2$; and
   a k-bit counter circuit for counting the number of bits in the serial data input that are at one binary logic level, in which k is the smallest integer such that $2^k$ is not less than $(n+1)$, and for generating the majority output signal at times when at least $(n+1)/2$ bits at the said logic level have been counted,
   in which the counter circuit comprises a plurality of serially connected counter stages, including a first counter stage and a last counter stage, and the total number of counter stages is equal to k, with each counter stage having a corresponding stage input terminal and stage output terminal for providing a stage output corresponding to one of the k bits of the counter circuit, wherein the stage input terminal of said first counter stage is coupled to the serial data input terminal,
   the stage output terminal of said last counter stage is coupled to the majority output terminal, and
   the counter stage output terminal of each counter stage other than the last is coupled to the stage input terminal of the next counter stage in said series.

2. A circuit in accordance with claim 1, in which the number of serial data input bits is an odd integer n such that $2^k$ is exactly equal to $(n+1)$.

3. A circuit in accordance with claim 2, and further comprising:
   a majority reset terminal for receiving a majority reset signal for resetting to zero the number of bits counted by the counter circuit, and
   a stage reset terminal on each of the counter stages, each of the stage reset terminals being coupled to the majority reset terminal for resetting each of the stage outputs in response to the receiving of the majority reset signal.

4. A circuit in accordance with claim 1, in which the number of serial data input bits is an odd integer n such that $2^k$ is greater than $(n+1)$.

5. A circuit in accordance with claim 4, and further comprising:
   a majority reset terminal for receiving a majority reset signal for resetting the number of bits counted by the counter circuit to a count equal to $$\frac{2^k - (n+1)}{2},$$

and
   a stage reset terminal or a stage set terminal on each of the counter stages, each of the stage reset and set terminals being coupled to the majority reset terminal, the stage reset terminal for resetting the stage output to zero, and the stage set terminal for setting the stage output to one, to provide stage outputs from the counter stages corresponding to a count equal to $$\frac{2^k - (n+1)}{2}$$

in response to the receiving of the majority reset signal.

6. A circuit in accordance with claim 5, in which the number of serial data input bits is an odd integer n such that $2^k$ is exactly equal to $(n+3)$, in which:
   the first counter stage has a stage set terminal coupled to the majority reset terminal; and
   each of the other counter stages has a stage reset terminal coupled to the majority reset terminal;
   whereby the number of bits counted by the counter circuit is set equal to 1 in response to the receiving of the majority reset signal.

7. A circuit in accordance with claim 5, and further comprising:
   an inverter connected to the majority reset terminal and connected to the stage set terminal for each of the counter stages having a stage set terminal.

* * * * *